Oct. 24, 1967 G. S. FREDRIKSON 3,348,657

SPRAY ETCHING DEVICE

Filed March 23, 1966 3 Sheets-Sheet 1

INVENTOR.
GLENN S. FREDRIKSON
BY
William H. Drummond
ATTORNEY

Oct. 24, 1967 G. S. FREDRIKSON 3,348,657

SPRAY ETCHING DEVICE

Filed March 23, 1966 3 Sheets-Sheet 2

INVENTOR.
GLENN S. FREDRIKSON
BY
William H. Drummond
ATTORNEY

Oct. 24, 1967 G. S. FREDRIKSON 3,348,657

SPRAY ETCHING DEVICE

Filed March 23, 1966 3 Sheets-Sheet 3

INVENTOR.
GLENN S. FREDRIKSON
BY William H. Drummond
ATTORNEY

United States Patent Office 3,348,657
Patented Oct. 24, 1967

3,348,657
SPRAY ETCHING DEVICE
Glenn S. Fredrikson, Mesa, Ariz., assignor to Dea Products, Incorporated, a corporation of Arizona
Filed Mar. 23, 1966, Ser. No. 536,758
2 Claims. (Cl. 198—127)

ABSTRACT OF THE DISCLOSURE

A spray etching device including a conveyor having rollers formed of helically wound wire; the rollers are driven through sprockets engaging a chain supported beneath the sprockets.

The present invention pertains to etching, and more particularly, to a device for implementing a spray etching process for the production of products such as etched circuit boards.

Present electronic and electrical technologies employ a variety of labor-saving techniques for wiring circuits and providing interconnection between electronic components. One important such device is a so-called "printed wiring board." Such boards are commonly produced through the expediency of a photo-etch process wherein a coating of photo-resist material is applied to a copper plated substrate. The coating is photographically exposed to a predetermined pattern thereby exposing some of the photo-resist material on the board and shrouding the remainder of the photo-resist material. The material is then developed which results in a pattern on the board of a developed emulsion having resistance to an etchant depending on whether or not any specific area of the material has been developed or exposed during the photo exposure. The board, with the photo-resist material thus developed, is then subjected to a photo-resist bath wherein the undeveloped portion of the photo-resist material are removed from the board.

The material remaining on the board protects the underlying layer of copper for the subsequent etchant bath which etches the copper on all exposed portions of the board. There are many variations of this process and a variety of other approaches to the placement of a pattern on a dielectric substrate having a conductive coating thereon. However, the present invention is intended primarily to facilitate the etchant removal of the material exposed to an etchant spray.

Technological advances have permitted the utilization of "double sided" printed wiring boards wherein both sides of the printed board are to be etched, and also to the development of very thin printed wiring boards which require substantial support during the etching process. The even application of the etchant in spray form to both sides of the printed wiring board, as well as the delicate support of the wiring board as it is being processed, give rise to numerous problems heretofore not completely solved by the prior art. For example, since the board must be supported on some sort of conveyor if the etchant process is to be a continuous one, the problem of the conveying means interfering with the even application of the spray on the underneath side of the board gives rise to "shadowing" or incomplete removal of the pattern metal on the bottom of the board. Further, in continuous etchant processes the extremely thin boards have been found to be so flexible as to be deformed into the conveyor itself, thus destroying the board and rendering the process inapplicable to such delicate devices.

Accordingly, it is an object of the present invention to provide spray etchant equipment that will evenly spray etch both sides of an article while it is continuously moved through a spray chamber.

It is another object of the present invention to provide a spray etchant device having a conveyor system that continuously contacts the underneath side of a device being etched therein at different points throughout its travel through the etchant chamber.

It is still another object of the present invention to provide a spray etchant device wherein a conveyor system is used utilizing an extremely simple and, nevertheless, dependable conveyor drive system to thereby enable the ready removal, repair, and adjustment of the conveyor system.

It is still another object of the present invention to provide a spray etcher conveyor system wherein extremely light and flexible devices being transported through the spray etch chamber may be gently conveyed without the danger of the device being caught in the conveyor system.

These and other objects of the present invention will become apparent to those skilled in the art as the description thereof proceeds.

Briefly, in accordance with one embodiment of the present invention, a spray etcher is provided utilizing a conveyor system having a plurality of printed wiring boards (or device to be etched) contacting "helical rollers" that contact and support the underside of the work being etched at continuously different points along the undersurface thereof. These helical rollers are journaled at each end and are driven at one end through a simple sprocket device forced only by the weight of the roller into contact with a driving chain. A journal plate is provided to prevent other than rotational motion of each of the helical rollers.

In yet another embodiment of the present invention, a plurality of conveyor rollers are provided, each roller comprising a wheel displaced from adjacent wheels along the length of the roller. Successive rollers in the conveyor device are arranged with their corresponding wheels axially displaced from each other so that adjacent rollers "intermesh" to provide a more continuous conveying and contacting surface for the work being supported thereon.

These and other features of the present invention will now be described by reference to the accompanying drawings in which.

Figure 1:
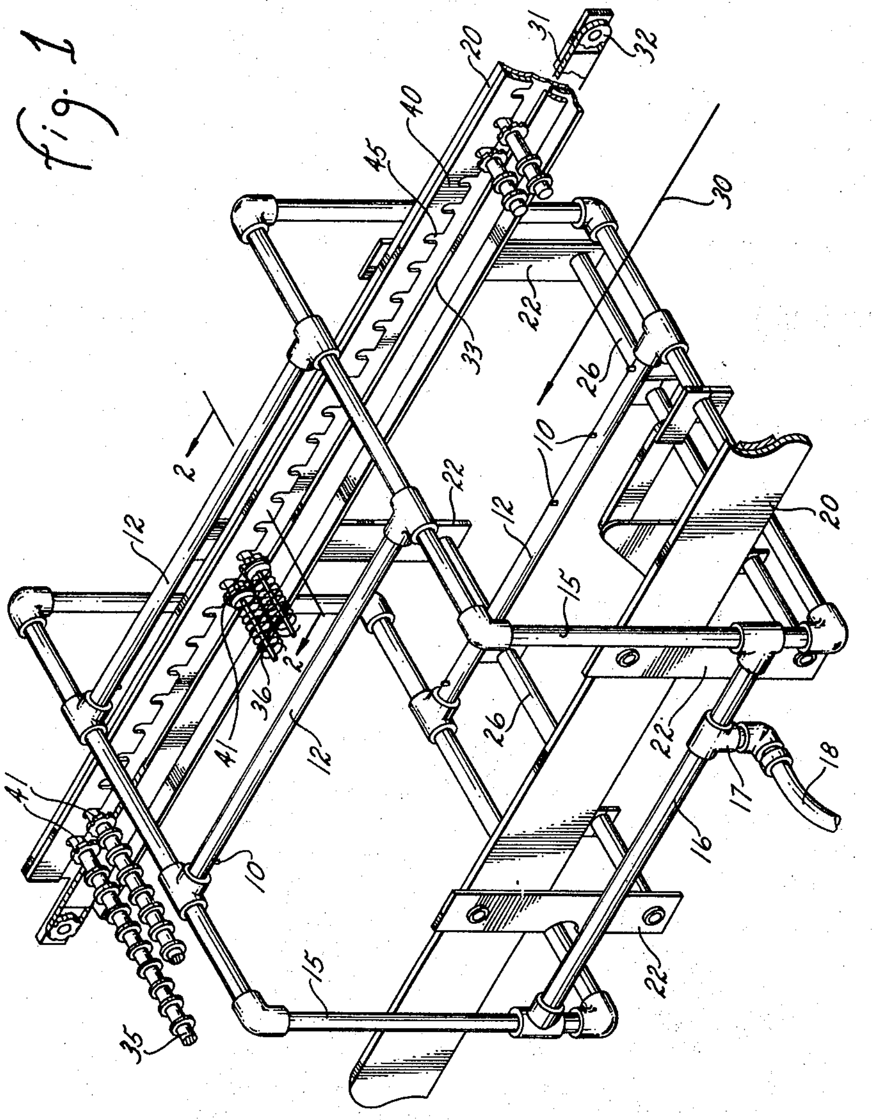
FIGURE 1 is a perspective view of a portion of the mechanism of the present invention illustrating the apparatus within a spray etch chamber constructed in accordance with the teachings of the present invention.

Referring now to FIGURE 1, the apparatus contained in a spray etching chamber constructed in accordance with the teachings of the present invention is shown. It will be understood by those skilled in the art that no specific type of spray etch arrangement need to be used; the arrangement shown in FIGURE 1 being illustrative only and intended to illustrate the manner in which the present invention may be applied. A plurality of spray nozzles 10 are arranged in a desired geometric pattern to provide a continuous spray of etchant directed upon work to be passed through the etchant chamber. In the embodiment chosen for illustration, the spray heads 10 are arranged on a plurality of longitudinally extending conduits 12 each of which communicates with a rectangular framework 15 at either end thereof; the framework 15 also comprising interconnected conduits. A supply conduit 16 connects each of the frames 15 to a supply T17 and a flexible connection 18 to a suitable source of etchant under pressure. The framework comprising the frames 15, the conduits 12, and the supply conduit 16 forms a framework within which an etchant chamber may be defined. The entire apparatus of FIGURE 1, in practice, will usually be enclosed to prevent the escape of the etchant spray therefrom. The framework thus defined, in the embodiment chosen for illustration, is mounted to the spray etcher frame 20 by depending support straps 22 that are pivotally secured to the frame 20 and which, in turn, support transverse bars 26 thereon. The bars 26 are rotatably mounted in the supports 22 and each provide a means for direct connection to the conduits 12. The pivotal mounting of the framework of conduits to the frame 20 of the etcher thus permits the entire conduit framework and spray nozzles carried thereon to be moved longitudinally in a rocking motion relative to the etcher frame 20.

Devices such as printed wiring boards to be etched are fed into the spray chamber in the direction indicated by the arrow 30 and are supported upon a conveyor system now to be described. A flexible chain 31, driven over a sprocket 32 and slidingly supported on a rail 33, travels longitudinally of the spray chamber. A plurality of rollers such as the wheel rollers 35 and helical rollers 36 are each journaled at each end thereof in a journal plate 40. Each roller is also provided with a drive sprocket 41 at one end thereof, said sprocket engaged in the links of the drive chain 31. Thus, as the drive chain 31 is moved longitudinally of the spray chamber, the drive sprockets on each of the rollers engage the chain and are forced to rotate since the roller is journaled in the journal plate 40 and restrained from longitudinal movement. In the event an obstruction interfers with the normal rotation of a roller, or in the event that a roller must be removed for replacement or repair, the journal plate 40 is provided with a plurality of slots 45 each corresponding to one of the rollers and each having a vertical height greater than that necessary to accommodate the end of the roller shaft. As a consequence of the slot having this enlarged vertical dimension, the individual rollers may simply be lifted off of the drive chain 31 and tilted to be removed from the spray chamber without affecting the remaining conveyor rollers or without disturbing the drive chain 31.

Figure 2:
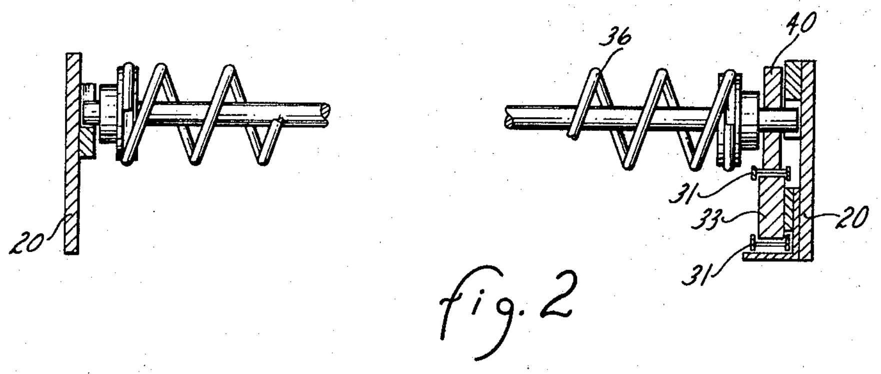
FIGURE 2 is a cross-sectional view of a portion of FIGURE 1 taken along line 2—2.

Referring to FIGURE 2, the sectional portion of FIGURE 1 taken along line 2—2 is shown. Therein it may be seen that the frame 20 of the spray etcher supports a rail 33 which in turn supports the drive chain 31. The sprocket 41 of the roller 36 is merely gravity-forced into contact with the drive chain 31. It is also evident from FIGURE 2 that the helical roller 36 may simply be removed by lifting it out of contact with the drive chain 31, tilting the roller, and removing it from the spray chamber.

Figure 3:
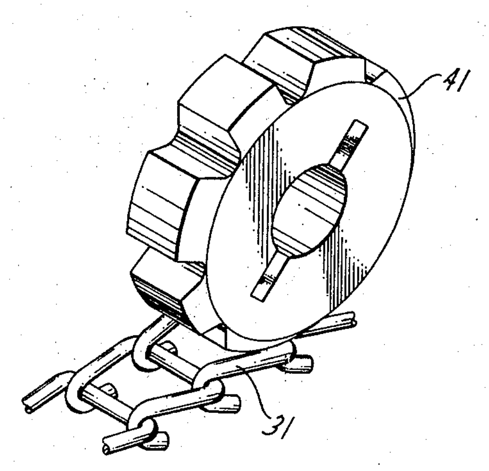
FIGURE 3 is a perspective view of a drive sprocket of one of the drive rollers of the conveyor of the present invention.

FIGURE 3 shows an enlarged perspective view of a drive sprocket 41 and the manner in which it engages the drive chain 31.

Figure 4:
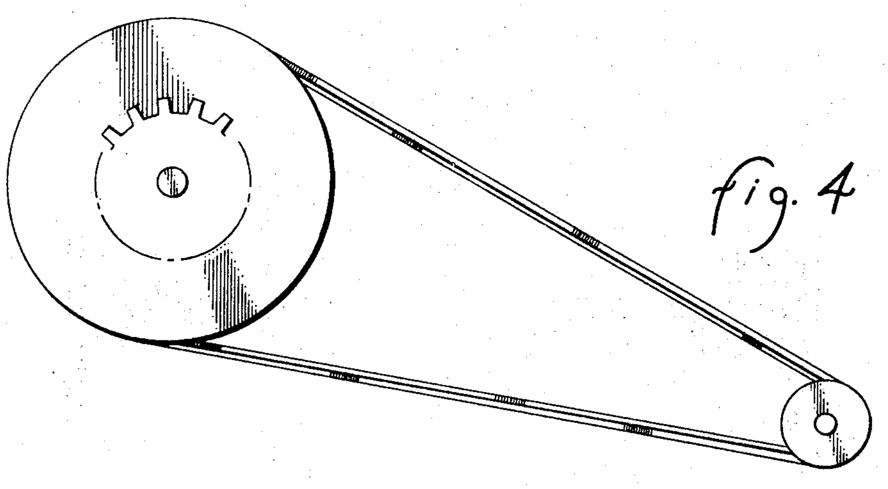
FIGURE 4 is a schematic representation of a means for driving a drive chain in the etcher of the present invention.

FIGURE 4 is intended only to illustrate that the drive sprocket 32 for the drive chain 31 may, in turn, be driven by any expedient such as, for example, a belt drive passing over a pair of pulleys in appropriate diameter relationship to achieve the desired reduction or increase in speed for the respective rollers.

Figures 5, 6:
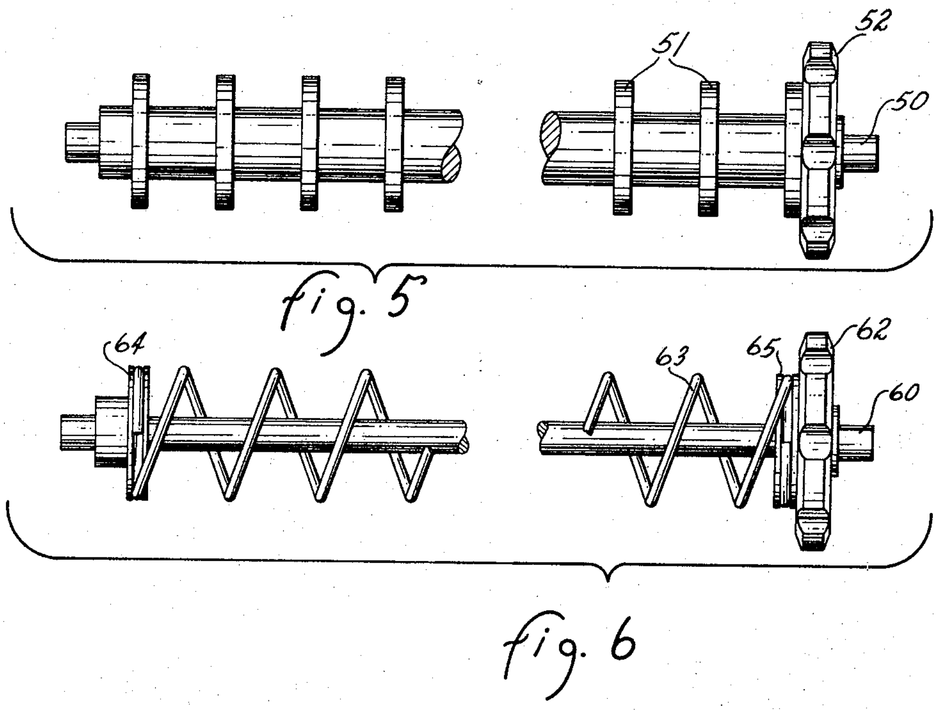
FIGURES 5 and 6 are illustrations showing conveyor wheels constructed in accordance with the teachings of the present invention.
Figure 7:
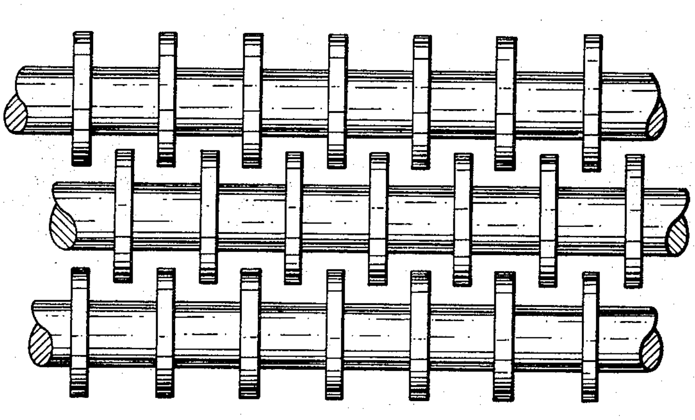
FIGURE 7 is an illustration of the manner in which the wheels of the conveyor roller of FIGURE 5 are positioned on successive rollers in the conveyor system.

Referring to FIGURE 5, a conveyor roller is shown of the type having a shaft 50 supporting a plurality of wheels 51 axially spaced therealong. The drive sprocket 52 is appropriately keyed, or otherwise fixed, to the shaft 50 so that rotation imparted to the sprocket by the drive chain is imparted to the wheels 51. The concept involving the conveyor roller of FIGURE 5 may best be demonstrated by reference to FIGURE 7 wherein a plurality of successive rollers of the type of FIGURE 5 are shown arranged in proper relationship to achieve the desired inventive concept. Successive rollers are arranged having their respective wheels offset in relation to the wheels of the next adjacent roller. The rollers are spaced, relative to each other, so that the peripheral surfaces of the wheels of adjacent rollers overlap; indeed, in many instances, it may be desirable to place the successive rollers in such proximity that the circumferential portion on each wheel merely touches the supporting axis of the adjacent roller.

Of particular significance to the present invention is the utilization of the helical roller shown in FIGURE 6. This roller comprises a support rod 60 having keyed thereto a drive sprocket in the manner described previously. However, to facilitate a more even contact between the spray being applied to the underneath side of a device being etched, the wheels of FIGURE 5 are dispensed with and replaced by a relatively stiff helical wire 63 wound about the axis of the supporting rods 60. The wire 63 is conventionally coated with an appropriate etchant-resistant plastic and is firmly anchored at either end 64 and 65 to a disc which, in turn, is keyed to the shaft 60. In this manner, as the roller is rotated about its axis, any work being supported thereon comes into contact with only the helically wound wire 63 and, therefore, the point of contact between the roller and the work will move transversely to the direction of the work motion (axially of the roller shaft) as well as moving axially of the work. In this manner, a minimum of the bottom surface of the work is "shrouded" by the conveyor to permit a more uniform access thereto by the spray emanating from the spray nozzles positioned beneath the conveyor. Under certain circumstances, the helical roller of FIGURE 6 may impart a slight sideward motion to the work being carried thereon; accordingly, it has been found convenient to wind successive helical rollers in opposite senses (left-hand helix alternating with a right-hand helix). In this manner, whatever tendency is imparted to the work to move transversely of its normal direction of travel through the spray chamber is counteracted by successive helical rollers.

It will be evident to those skilled in the art that the helical roller of FIGURE 6 need not be formed by a perfect helix and may as readily be formed using wire, or other material, wound about an imaginary cylinder to form a variety of patterns other than the helix shown. For example, in certain circumstances, it may be found desirable to vary the pitch of the helix from one end of the roller to the other; further, the wire may take an irregular shape such that only the extreme radial portions extending from the shaft 60 define a cylindrical surface and the remainder of the wire may form an irregular pattern.

It will be obvious to those skilled in the art that the description given above pertains to a chosen embodiment to illustrate the concept of the present invention. It will also be evident to those skilled in the art that many modifications may be made from the embodiments chosen for illustration without departing from the spirit and scope of the invention. Such variation from the embodiment chosen for illustration may be, for example, the elimination of the supporting shaft between the discs to which the helically wound wires attach. In many instances it will be found that the supporting wire is sufficiently stiff to negate the necessity of providing a supporting shaft extending throughout the entire length of the conveyor roller.

I claim:

1. In etching equipment, an improved conveyor having a plurality of rollers for advancing work through an etch-chamber or the like, each roller including means supporting said roller at either end thereof, a wire interconnecting either end of said roller, said wire helically wound about an axis passing through said supporting means to provide a contact surface to support work thereon, said surface being contained in a single cylindrical surface, a drive sprocket attached for rotation with said wire about an axis passing through said supporting means, said drive sprockts engaging a drive chain supported beneath said sprocket, said sprocket urged into driving engagement with said chain only by gravity, and means restraining horizontal movement of said sprockets.

2. The combination set forth in claim 1 wherein said drive chain is supported throughout substantially the length of said spray chamber by a support rail slidingly engaging said drive chain.

References Cited

UNITED STATES PATENTS

| | | | |
|---|---|---|---|
| 1,761,199 | 6/1930 | Drake | 198—127 X |
| 1,767,914 | 6/1930 | Boudin | 198—127 X |
| 2,393,471 | 1/1946 | Johnson | 198—127 X |
| 3,053,368 | 9/1962 | Klahn | 193—35 |
| 3,170,561 | 2/1965 | Schneider | 198—127 |
| 3,219,166 | 11/1965 | Collins | 198—127 X |

EVON C. BLUNK, *Primary Examiner.*

EDWARD A. SPROKA, *Examiner.*